(12) United States Patent
Kim et al.

(10) Patent No.: US 6,339,343 B1
(45) Date of Patent: Jan. 15, 2002

(54) DATA I/O BUFFER CONTROL CIRCUIT

(75) Inventors: Dong Kyeun Kim; Jong Hoon Park; San Ha Park, all of Chungcheongbuk-do (KR)

(73) Assignee: Hyundai Electronics. Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/407,172

(22) Filed: Sep. 28, 1999

(30) Foreign Application Priority Data

Nov. 24, 1998 (KR) .............................. 10-50440

(51) Int. Cl.[7] .......................................... H03K 9/0185
(52) U.S. Cl. ................... 326/83; 326/86; 326/93
(58) Field of Search ........................ 326/83, 86, 93, 326/95, 98, 112, 119, 121

(56) References Cited

U.S. PATENT DOCUMENTS

| 4,758,985 A | * | 7/1988 | Carter ........................... 326/86 |
| 4,857,763 A | * | 8/1989 | Sakurai et al. ............... 326/121 |
| 4,987,319 A | * | 1/1991 | Kawana ........................ 326/86 |
| 5,300,835 A | | 4/1994 | Assar et al. ................. 307/475 |
| 5,898,320 A | * | 4/1999 | Li et al. ...................... 326/121 |
| 5,949,254 A | * | 7/1999 | Keeth ........................... 326/83 |
| 6,124,737 A | * | 9/2000 | Lan et al. ................... 326/121 |

* cited by examiner

*Primary Examiner*—Michael Tokar
*Assistant Examiner*—Don Phu Le
(74) *Attorney, Agent, or Firm*—Fleshner & Kim, LLP

(57) ABSTRACT

A circuit controls data input/output buffers, where an input buffer is disabled during a read mode for reducing power consumption. In a preferred embodiment, a data input buffer is enabled in response to a control signal to receive data from an input/output pad. A data output buffer provides data to the input/output pad in response to the control signal. A data input/output buffer control unit generates the control signal to disable the data input buffer and enable the data output buffer in read mode. Preferably, the circuit is readily applicable to a memory device, such as a Synchronous Dynamic Random Access Memory (SDRAM).

12 Claims, 2 Drawing Sheets

DATA I/O BUFFER CONTROL CIRCUIT

BACKGROUND OF THE INVENTION

1. Field of the Invention

The present invention relates to a control circuit and more particularly, a data input/output buffer control circuit for a memory device.

2. Background of the Related Art

In general, a DRAM, a combination of integrated devices, is widely used as a memory device with a high packing density. Unfortunately, the DRAM has a long data read time and low operational speed due to delayed command signals such as RASB and CASB, and a read operation based a Y-address signal. Accordingly, a SDRAM has been developed as an alternative to DRAM for faster read and operational speeds. In the SDRAM, data input and data outputs are implemental using a single input/output pad. Further, both the data input buffer and the data (output buffer are connected to the data input/output pad.

FIG. 1 illustrates a related art circuit for controlling data input/output buffers for the SDRAM. The data input/output buffers include an input/output (I/O) pad 1 for data input or output, the data input buffer 2, the data output buffer 5, and the data output buffer control unit 10. The data input buffer 2 has a first PMOS transistor 3 and a first NMOS transistor 4 for input of data to the SDRAM through the I/O pad 1, and the data output buffer 5 has a NAND gate 6, a NOR gate 7, a PMOS transistor 8, and a NMOS transistor 9, for providing data from the SDRAM to the I/O pad 1. The data output buffer control unit 10 generates a control signal DOEB in response to a clock signal CLK and a read command READE to control the data output buffer 5.

When data is read from the SDRAM, the read command signal READE is provided to the control unit 10, where the read command READE transits a "low" level to a "high" level. Upon reception of the READE signal, the data output buffer control unit 10 generates the control signal DOEB which transits from the "high" to "low" level in synchronization with the clock signal CLK, for enabling the data output buffer 5 after a preset time interval. While the control signal DOEB from the data output buffer control unit 10 is held at the "low" level, the data output buffer 5 is enabled to provide data DOUT from the SDRAM to the I/O pad 1. When the read operation ends, the "READE" signal is switched from the "high" to "low" level so that the data output buffer control unit 10 switches the control signal DOEB from the "low" to "high" level after a preset time period, for disenabling the data output buffer 5. Accordingly, the data output buffer 5 is brought into a "high impedance" state.

However, the related art circuit for controlling input/output buffer has various disadvantages. For example, in the related art circuit for controlling input/output buffers, there is an unnecessary induction of a switching current at the data input buffer caused by output data fed back to the data input buffer when the data output buffer outputs data to the I/O pad in a read operation. The feedback becomes greater as a plurality of data is continuously read.

The above references and/or discussion are incorporated by reference herein where appropriate for appropriate teachings of additional or alternative details, features and/or technical background.

SUMMARY OF THE INVENTION

Accordingly, the present invention is to substantially obviate at least one or more of the problems of the related art.

An object of the present invention is to prevent generation of a switching current.

Another object of the present invention is to eliminate unnecessary switching current.

A further object of the present invention is to reduce power consumption.

The present invention can be achieved in a whole or in parts by a circuit for controlling data input/output buffers includes a semiconductor circuit, comprising an input/output pad for at least one of input and output of data; a data input buffer for receiving data from the input/output pad; a data output buffer for output of the data to the input/output pad; and, a controller that provides a control signal to control the data input and output buffers such that only one of the data input buffer and the data output buffer is enabled during a prescribed operation.

The present invention can be also achieved in a whole or in parts by a data input buffer comprising a plurality of transistors coupled in series, and a first transistor having first and second electrodes and a control electrode, wherein the first electrode of the first transistor is coupled to a serial connection within the plurality of transistors coupled in series.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
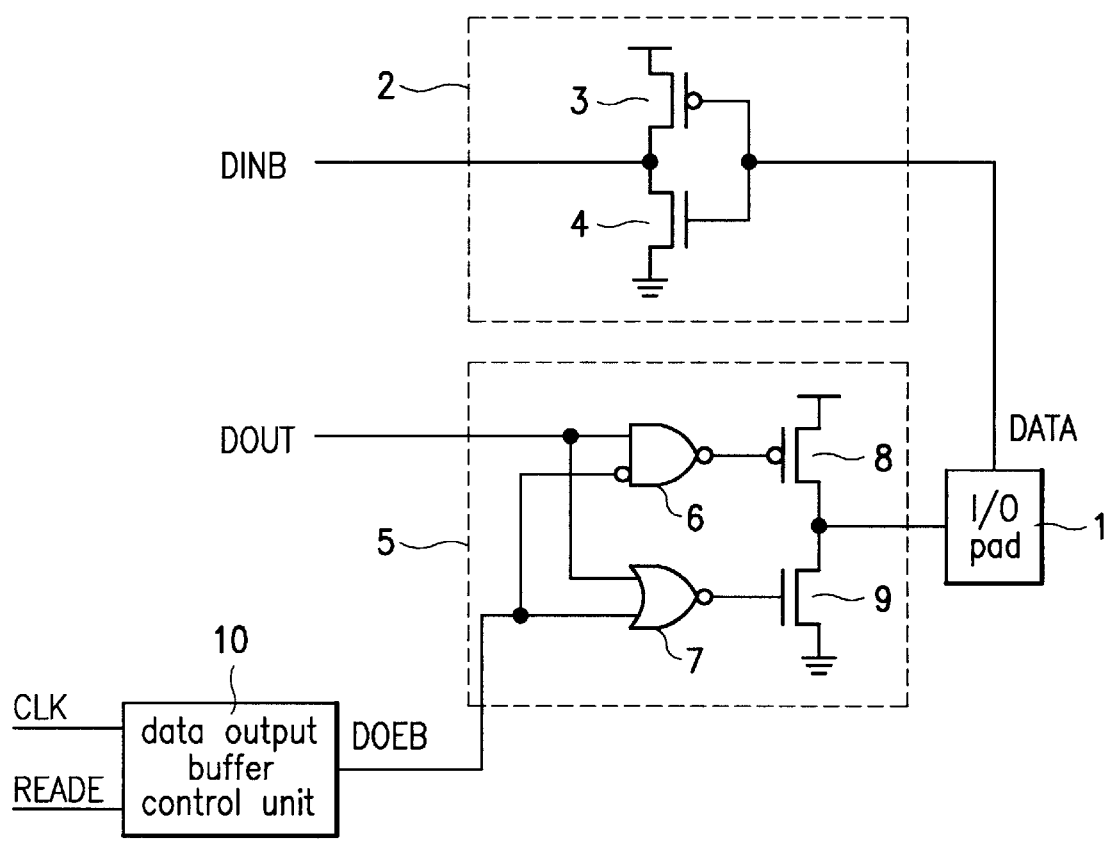
FIG. 1 illustrates a diagram of a related art circuit for controlling data input/output buffers for an SDRAM; and, FIG. 2 illustrates a diagram of a circuit for controlling data input/output buffers for a memory device in accordance with a preferred embodiment of the present invention.
Figure 2:
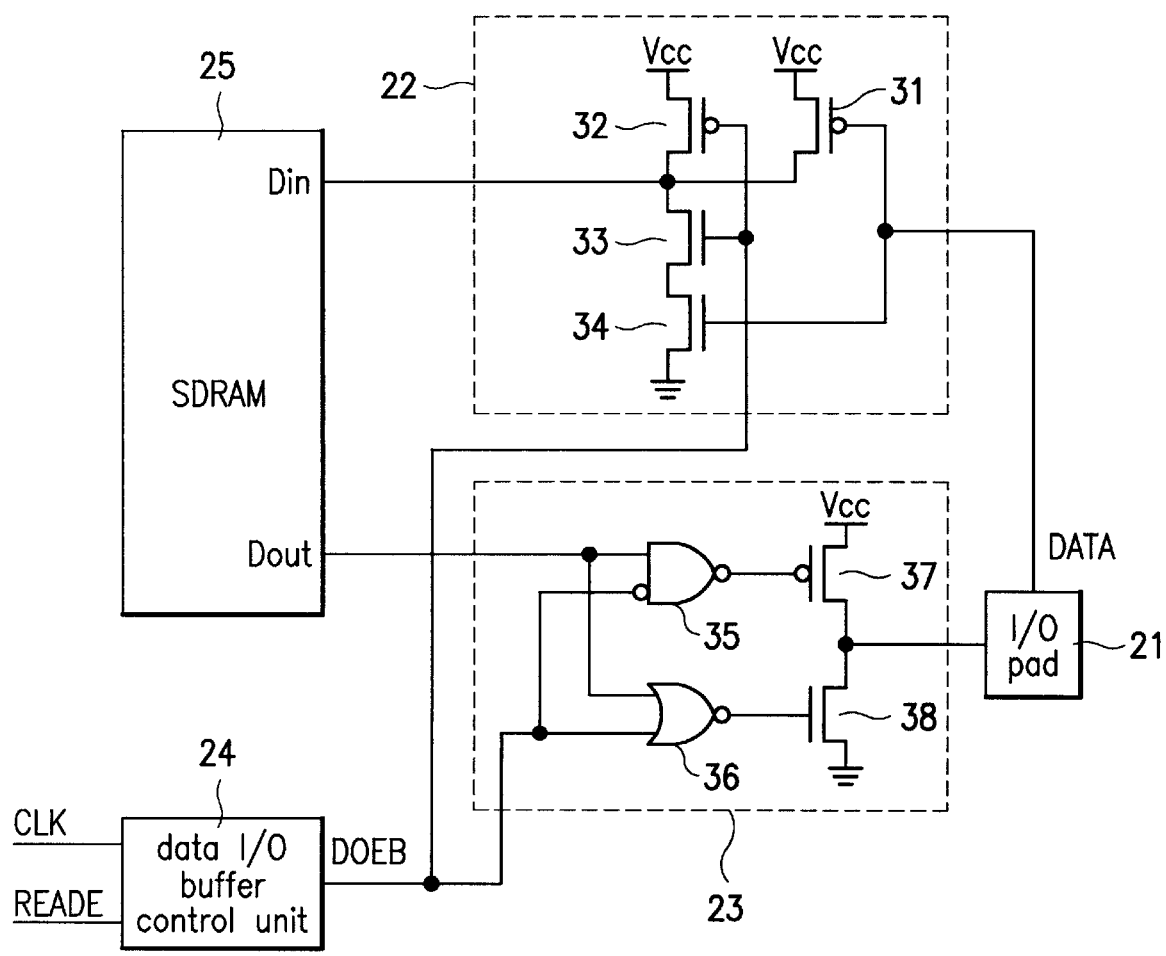

FIG. 2 illustrates a circuit for controlling data input/output buffers for an SDRAM in accordance with a preferred embodiment of the present invention. The circuit includes an I/O pad 21, a data input buffer 22, a data output buffer 23, and a data I/O buffer control unit 24. The I/O pad 21 is for input or output of data, and the data input buffer 22 is for input of data received through the I/O pad 21 to a memory device 25, preferably SDRAM. The data output buffer 23 is for data output to the memory device 25 through the I/O pad 21, and the data I/O buffer control unit 24 generates a control signal DOEB for controlling the data input buffer 2 and the data output buffer 23 in response to a clock signal CLK and a read command signal READE so that the data input buffer 22 is disabled and the data output buffer 23 is enabled during a read mode.

The data input buffer 22 includes two PMOS transistors 31, 32 and two NMOS transistors 33,34. A first PMOS 31 transistor has a drain for connection to a voltage source Vcc, a source connected to an input terminal Din of the memory device 25, and a gate connected to the I/O pad 21. A second PMOS transistor 32 has a drain for connection to a voltage source Vcc, a source connected to the source of the first PMOS transistor 31, and a gate coupled for receiving to a control signal DOEB from a data I/O buffer control unit 24. A first NMOS transistor 33 has a source connected to the sources of the first and second PMOS transistor 31, 32, and a gate coupled for receiving the control signal DOEB from the data I/O buffer control unit 24. A second NMOS transistor 34 has a source connected to the drain of the first NMOS transistor 33, a drain or coupling to a ground potential, and a gate connected to the I/O pad 21.

The data output buffer 23 includes a NAND gate 35, a NOR gate 36, a PMOS transistor 37 and an NMOS transistor 38. The NAND gate 35 receives the data from the memory device 25 and an inverted signal of the control signal DOEB from the data I/O buffer control unit 24 for a logical NAND operation, and the NOR gate 36 receives the data from the memory device 25 and the control signal DOEB from the data I/O buffer control unit 24 for a logical NOR operation. The PMOS transistor 37 has a drain for connection to a voltage source Vcc, a source connected to the I/O pad 21, and a gate for connection to receive an output of the NAND gate 35, while the NMOS transistor 38 has a source connected to the source of the PMOS transistor 37, a drain for connection to a ground potential, and a gate for connection to receive an output of the NOR gate 36.

For a read mode operation, a read command signal READE is generated in order to read data from the memory device 25 and the read command signal READE transits from the "low" to "high" level. Upon receipt of the "high" level read command signal READE, the data I/O buffer control unit 24 generates the control signal DOEB which transits the "high" to "low" level such that the data output buffer 23 is enabled and the data input buffer 22 is disabled after a preset time period in synchronization with the clock signal CLK. Accordingly, the data output buffer 23 is enabled while the control signal DOEB from the data I/O buffer control unit 24 is held at the "low" level, to provide the data at the output terminal DOUT received from the memory device 25 to the I/O pad 21.

When the control signal DOEB from the data I/O buffer control unit 24 is maintained at the "low" level, the NAND gate 35 and the NOR gate 36 invert the data from the memory device 25. If the data from the memory device 25 is at the "high" level, the PMOS transistor 37 is turned on based on the output signal from the NAND gate 35, and if the data from the memory device 25 is at the "low" level, an NMOS transistor 38 is turned on based on the output of the NOR gate 36 to provide the data to the I/O pad.

Since the data input buffer 22 is disabled while the control signal DOEB from the data I/O buffer control unit 24 is held at the "low" level, if the data output buffer 23 provides the data from the memory device 25 to the I/O pad 21, the data from the I/O pad is not fed back to the memory device 25. By designing the second PMOS transistor 32 and the first NMOS transistor 33 to provide "high" level signals in response to the control signal DOEB regardless of the signal from the I/O pad 21, no toggle occurs. When the read operation ends by an external or internal control, the command signal READE switches from the "high" to "low" level again, so that the data I/O buffer control unit 24 switches the control signal DOEB from the "low" to "high" level after a preset time period, thus disabling the data output buffer 23 and enabling the data input buffer 22.

The circuit for controlling data input/output buffers of the present invention as explained has various advantages. For example, the current consumption during the lead operation is reduced. In particular, by disabling the data input buffer when the data output buffer is enabled for reading the data, unnecessary switching current caused by read data fed back to the data input buffer can be eliminated.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor circuit, comprising:
   an input/output pad for at least one of input and output of data;
   a data input buffer for receiving data from the input/output pad;
   a data output buffer for output of the data to the input/output pad; and,
   a controller that provides a control signal to control the data input and output buffers such that only one of the data input buffer and the data output buffer is enabled during a prescribed operation, wherein the data input buffer comprises,
      a first transistor having first and second electrodes and a control electrode, and
      second, third and fourth transistors, each having first and second electrodes and a control electrode, wherein the first and second electrodes of the second and third transistors, respectively, are commonly coupled to the first electrode of the first transistor, wherein the first and second electrodes of the third and fourth transistors, respectively, are commonly coupled, and wherein the control electrode of the first and fourth transistors is coupled to the input/output pad to receive the data, and the control electrode of the second and third transistors is coupled for receiving the control signal.

2. The semiconductor circuit of claim 1, wherein first and second transistors are PMOS transistors and third and fourth transistors are NMOS transistors.

3. The semiconductor circuit of claim 1, further comprising a memory device coupled to the data input and output buffers.

4. The semiconductor circuit of claim 3, wherein said memory device is a Synchronous Dynamic Random Access Memory (SDRAM) device SRAM.

5. The semiconductor circuit of claim 1, wherein said prescribed operation is a read operation.

6. The semiconductor circuit of claim 1, wherein said prescribed operation is a write operation.

7. The semiconductor circuit of claim 1, wherein said data output buffer comprises a logic circuit coupled to receive data and the control signal, and a plurality of transistors coupled in series and responsive to outputs of the logic circuit.

8. The semiconductor circuit of claim 7, wherein said logic circuit comprises first and second logic gates, each logic gate having two inputs and one output, the first input of first and second of logic gates receiving the control signal, the second input of the firsts logic gate receiving an inverted signal of the control signal, the second input of the first and second logic gates receiving the data, and the output from each of the first and second logic gates controlling the plurality of transistors coupled in series.

9. The semiconductor circuit of claim 8, wherein said plurality of transistors comprises first and second transistors, each having first and second electrodes and a control electrode, the first and second electrodes of the first and second transistor, respectively, are commonly coupled, and the control electrode of the first transistor being coupled for receiving the output of the first logic gate and the control electrode of the second transistor being coupled for receiving the output of the second logic gate.

10. The semiconductor circuit of claim 9, wherein the first and second logic gates are NAND and NOR gates, respectively.

11. The semiconductor circuit of claim 9, wherein the first transistor is a PMOS transistor and the second transistor is an NMOS transistor.

12. A semiconductor circuit, comprising:

input/output pad means for at least one of inputting and outputting of data;

data input buffer means for receiving data from the input/output pad means;

data output buffer means for outputting the data to the input/output pad means; and control means for providing a control signal to control the data input and output buffer means such that only one of the data input buffer means and the data output buffer means is enabled during a prescribed operation, wherein the data input buffer means comprises, first, second, third and fourth transistors means for selectively switching data, each transistor means having first and second electrodes and a control electrode, wherein the first and second electrodes of the second and third transistor means, respectively, are commonly coupled to the first electrode of the first transistor means, wherein the first and second electrodes of the third and fourth transistor means, respectively, are commonly coupled, wherein the control electrode of the first and fourth transistors is coupled to the input/output pad means to receive the data, and wherein the control electrode of the second and third transistors is coupled for receiving the control signal.

\* \* \* \* \*